(12) United States Patent
Uemura (10) Patent No.: US 6,323,708 B1
(45) Date of Patent: Nov. 27, 2001

(54) FLIP-FLOP CIRCUIT (75) Inventor: Tetsuya Uemura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,793

(22) Filed: Apr. 26, 2000

(30) Foreign Application Priority Data

Apr. 28, 1999 (JP) .................................................. 11-120987

(51) Int. Cl.⁷ ............................ G11C 19/00; H03K 3/357
(52) U.S. Cl. ........................ 327/195; 327/196; 327/570; 326/134; 326/135
(58) Field of Search ..................................... 327/169, 192, 327/195–197, 402, 498, 499, 500, 568, 570; 326/132, 134, 135

(56) References Cited

U.S. PATENT DOCUMENTS 5,313,117 * 5/1994 Maezawa ............................... 257/104
5,543,748 * 8/1996 Ando ..................................... 327/570
5,930,323 * 7/1999 Tang et al. ............................. 377/77

FOREIGN PATENT DOCUMENTS 5-41520    2/1993  (JP) .
9-162705   6/1997  (JP) .

* cited by examiner

Primary Examiner—Tuan T. Lam
(74) Attorney, Agent, or Firm—Scully, Scott, Murphy & Presser (57) ABSTRACT

The present invention includes: a series circuit which has a negative differential resistance element and another negative differential resistance element that has a control terminal capable of controlling a value of an element current; a transfer gate; a latch circuit which has negative differential resistance elements connected in series; and an inverter circuit which has an FET as a drive element and a negative differential resistance element as a load element. With this, such a flip-flop can be obtained that when a clock signal is applied to a power supply terminal of the series circuit and a control terminal of the transfer gate and an input signal is supplied to the control terminal of the negative differential resistance element, an output is placed at a terminal.

8 Claims, 7 Drawing Sheets

characteristics when clock signal is at low

FIG.6B (PRIOR ART)

characteristics when clock signal is at high and input is at high

FIG.6C (PRIOR ART)

characteristics when clock signal is at high and input is at low

FIG. 7A (PRIOR ART)

characteristics when Y1 and Y2 are both at low

FIG. 7B (PRIOR ART)

characteristics when Y1 is at high and Y2 is at low

FIG. 7C (PRIOR ART)

characteristics when Y1 is at low and Y2 is at high

FLIP-FLOP CIRCUIT

BACKGROUND OF THE INVENTION

1. Field of the Invention

The present invention relates to a flip-flop circuit and more particularly to the flip-flop circuit which is incorporated in a semiconductor memory device or a variety of semiconductor integrated-circuit (IC) device or a like.

2. Description of the Related Art

There has been proposed by Akeyoshi et al. such a flip-flop circuit which includes a smaller number of elements by utilizing functionality of a negative differential resistance element. This type of flip-flop circuit is disclosed in Japanese Laid-Open Patent Application No. Hei-9-162705.

Figure 5:
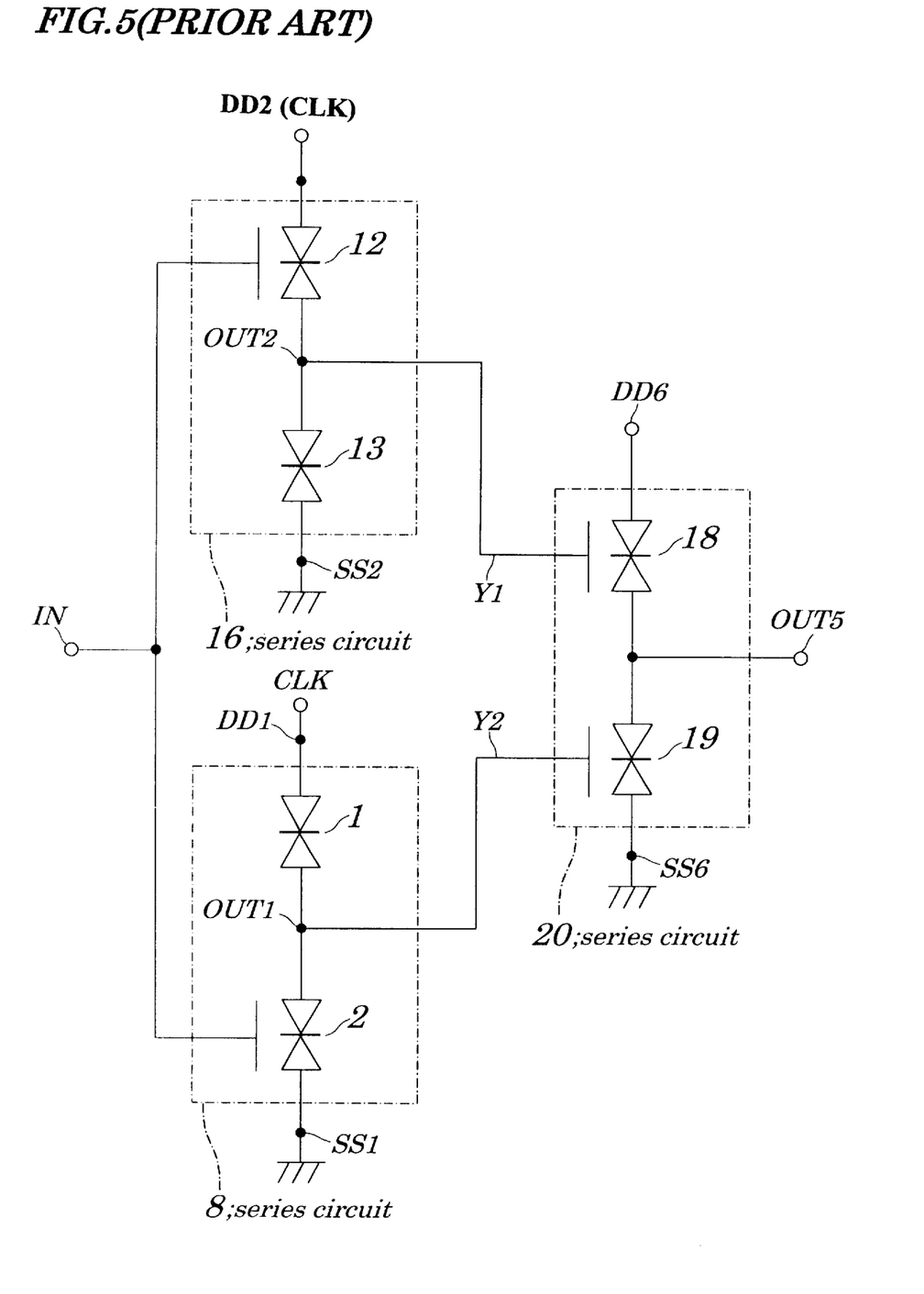
FIG. 5 is a circuit diagram of a prior art example.

The configuration and operations of this prior art flip-flop circuit are briefly described with reference to FIG. 5. FIG. 5 shows the circuit diagram of a conventional D flip-flop circuit. This prior art circuit includes negative differential resistance elements 2, 12, 18 and 19 having a terminal for controlling an element current value, other negative differential resistance elements 1 and 13, and series circuits 8, 16, and 20 consisting of pairs of the negative differential resistance elements 1 and 2, 12 and 13, and 18 and 19 respectively.

Terminals SS1, SS2, and SS6 are grounded, while power supply terminals DD1 and DD2 of the series circuits 8 and 16 respectively are supplied with a vibration voltage synchronized with a clock signal CLK. A power supply terminal DD6 of the series circuit 20, on the other hand, is supplied with a constant voltage. To a control terminal of the negative differential resistance elements 2 and 12 is applied an input signal, so that an output of this circuit as a whole is placed at an output terminal OUT5 of the series circuit 20.

Figure 6A:
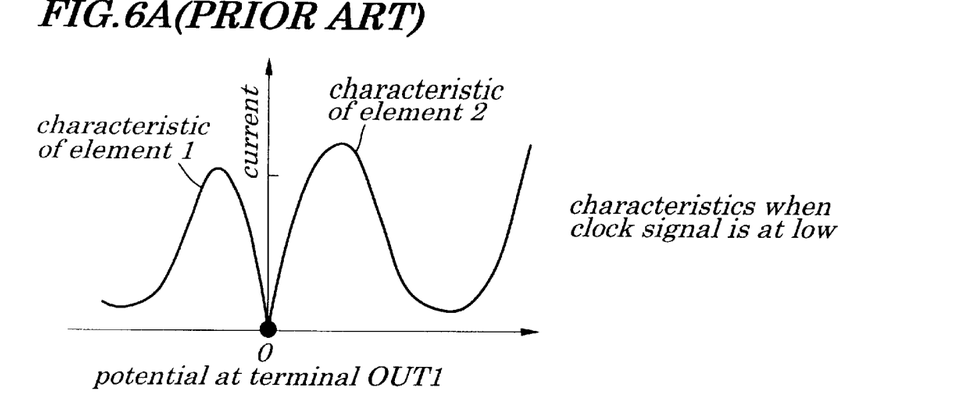
FIGS. 6A, 6B and 6C are graphs showing operations of the prior art example and a series circuit of the present invention.
Figure 6B:
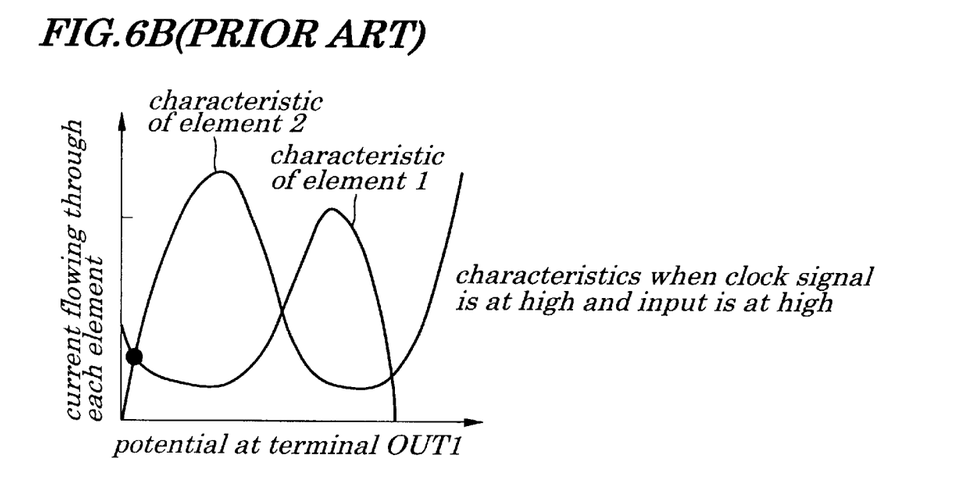
Figure 6C:
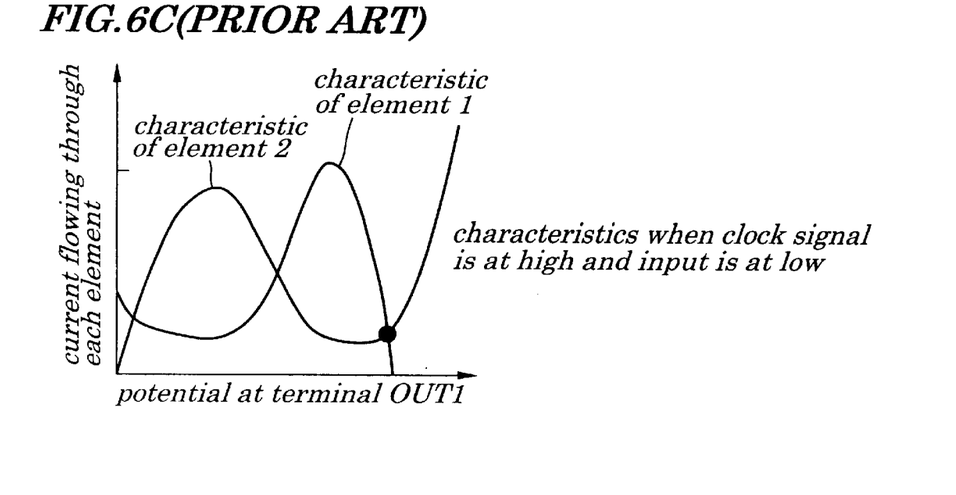

FIGS. 6A, 6B and 6C show load curves indicating operations of the series circuit 8. Here, the negative differential resistance elements 1 and 2 are set to have such characteristics that when the input signal is at a high level (hereafter abbreviated as High), the negative differential resistance element 2, a peak current of which can be controlled with an input signal level, may have a larger peak current than that of the negative differential resistance element 1 and, when the input signal is at a low level (hereinafter abbreviated as Low) on the other hand, the negative differential resistance element 2 may have a smaller peak current than that of the negative differential resistance element 1.

With this, when the clock signal CLK is at Low, a potential of an output terminal OUT1 stays at Low irrespective of a level of the input voltage as shown in FIG. 6A. When the clock signal CLK becomes High, a potential at the terminal DD1 rises, to provide a load curve shown in either FIG. 6B or FIG. 6C so that the potential at the output terminal OUT1 may enter a Low-High bi-stable state. When the input signal is at High and the negative differential resistance element 2 has a larger peak current than the negative differential resistance element 1 as shown in FIG. 6B, the output terminal OUT1 becomes Low and, when the input signal is at Low, on an other hand, as shown in FIG. 6C, the output terminal OUT1 becomes High. Once a voltage level of the output terminal OUT1 is determined in state, this state is held as long as the clock signal CLK remains at High, even when the input signal changes in level. That is, an inverted value of the input signal at a leading edge of the clock signal CLK appears at the output terminal OUT1.

For the series circuit 16, on the other hand, the negative differential resistance elements 12 and 13 are set to have such characteristics that when the input signal is at High, the negative differential resistance element 12 may have a larger peak current than that of the negative differential resistance element 13 and, when the input signal is at Low, may have a smaller one; with this, at the leading edge of the clock signal CLK, a signal having a same phase as the input signal is output at an output terminal OUT2 and held as is until the clock signal CLK rises completely.

Figure 7A:
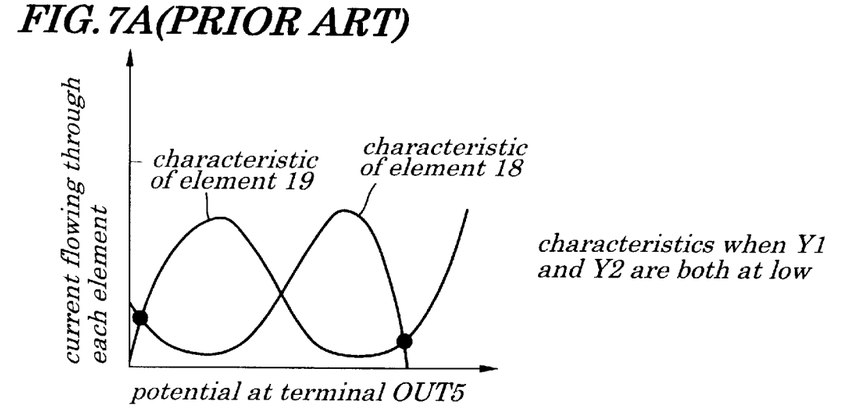
FIGS. 7A, 7B and 7C are graphs showing operations of the series circuit of the prior art.
Figure 7B:
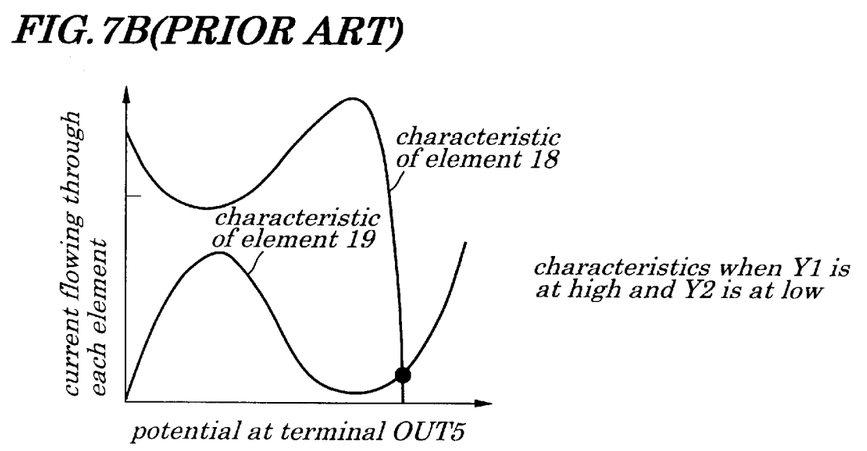
Figure 7C:
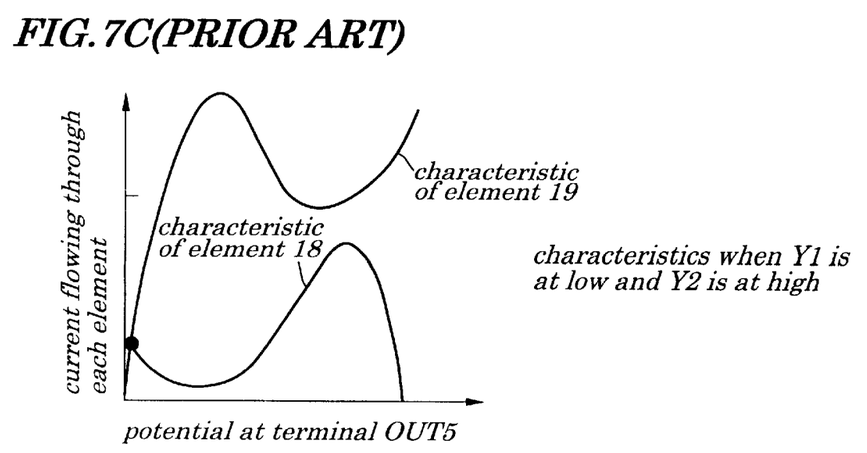

FIGS. 7A, 7B and 7C show load curves of the series circuit 20. The series circuit 20 is driven by a power supply which supplies a constant voltage. As shown in FIG. 7A, when both control terminals Y1 and Y2 of the negative differential resistance elements 18 and 19 respectively are at Low, a potential of the output terminal OUT5 performs a bi-stable latch operation. If, in this case, only the control terminal Y1 of the negative differential resistance element 18 becomes High in potential, as shown in FIG. 7B, the output voltage also becomes High and, even when the control terminal Y1 gets back to Low subsequently, the output stays at High. When, once the control terminal Y2 of the negative differential resistance element 19 becomes High in potential, as shown in FIG. 7C, the output voltage becomes Low and, even when the control terminal Y2 gets back to Low subsequently, the output voltage stays at Low.

As shown in FIG. 5, the output terminal OUT1 in the series circuit 8 is connected to the control terminal Y2 of the negative differential resistance element 19 in series circuit 20, while the output terminal OUT2 in the series circuit 8 is connected to the control terminal Y1 of the negative differential resistance element 18 in the series circuit 20. When the input voltage is at High, at the leading edge of the clock signal CLK, the output of the series circuit 16 becomes High and that of the series circuit 8 becomes Low, so that the output terminal OUT1 of the series circuit 20 becomes High. Even if the input signal changes in level when the clock signal CLK is at High, states of the output terminals OUT1 and OUT2 both remain unchanged, thus holding an output potential as is.

Further, even when the clock signal CLK falls in potential and so the output terminals OUT1 and OUT2 both become Low, the series circuit 20 holds the output voltage as is. Similarly, with the input signal held at Low, when the clock signal CLK rises in potential, the output terminal OUT5 becomes Low and remains as is until the clock signal CLK rises next time. That is, this circuit acts as a D flip-flop circuit which is triggered at a positive-going edge.

If, in this circuit, a resonant tunnel diode is employed as the negative differential resistance elements 1 and 13 and a parallel-connected element consisting of the resonant tunnel diode and a Field Effect Transistor (FET) is employed as the negative differential resistance elements 2, 12, 18, and 19 having the terminal for controlling the element current value, the number of elements required can be reduced to ten, thus providing a remarkable decrease as compared to a circuit which includes only FETS.

Thus, in the prior art example, by utilizing a functionality of the negative differential resistance elements, the number of elements required can be reduced remarkably as compared to a case where only transistors are employed to make up the circuit. Semiconductor memory devices and IC devices have recently been needed to be even higher in integration density and even larger in scale. With this, it is necessary to reduce a number of required elements and area of the flip-flop circuit which is incorporated in large number in such the semiconductor memory device and IC device. Its power consumption also is desired to be less as much as possible.

SUMMARY OF THE INVENTION

In view of the above, it is an object of the present invention to provide a flip-flop circuit which can bring about a decrease in both a number of elements and area of circuitry. It is another object of the present invention to provide the flip-flop circuit which can reduce power consumption.

According to a first aspect of the present invention, there is provided a flip-flop circuit which includes:

a series circuit which has a first negative differential resistance element and a second negative differential resistance element in such a configuration that one end of the first negative differential resistance element and one end of the second negative differential resistance element are interconnected at a common series connection point, that the second negative differential resistance element has a control terminal for controlling a value of an element current, and that the series connection point acts as an output terminal;

clock supplying circuit for supplying a clock signal as an operating power supply for said series circuit;

a latch circuit;

a transfer gate which is disposed between an output terminal of the series circuit and the latch circuit and also which is turned ON and OFF by the clock signal; and an inverter circuit which is connected to the latch circuit;

wherein an input signal is applied to the control terminal of the second negative differential resistance element, while an output of the inverter circuit is placed as an output signal.

In the foregoing first aspect, a preferable mode is one wherein the latch circuit comprises a third negative differential resistance element and a fourth negative differential resistance element which are connected in series between a reference potential and a power supply potential.

Also, a preferable mode is one wherein the first negative differential resistance element is a resonant tunnel diode.

Also, a preferable mode is one wherein the second negative differential resistance element is a parallel-connected element consisting of a resonant tunnel diode and an FET element.

Also, a preferable mode is one wherein the vibration voltage supplying circuit is adapted to directly supply the clock signal to a power supply terminal of the series circuit as an operating power supply thereof. Also, a preferable mode is one wherein the vibration voltage supplying circuit is adapted to supply an operating power supply for the first or second series circuit via an FET element which is turned ON and OFF in synchronization with the clock signal.

According to a second aspect of the present invention, there is provided a flip-flop circuit comprising:

a series circuit which has a first negative differential resistance element and a second differential resistance element in such a configuration that one end of the first negative differential resistance element and one end of the second negative differential resistance element are interconnected at a common series connection point, that at least the first negative differential resistance element has a control terminal for controlling a value of an element current, and that the common series connection point acts as an output terminal;

clock supplying circuit for supplying a clock signal as an operating power supply for said series circuit;

a latch circuit;

a transfer gate which is disposed between an output terminal of the series circuit and the latch circuit and also which is turned ON and OFF by the clock signal; and a buffer circuit which is connected to the latch circuit;

wherein an input signal is applied to the control terminal of the first negative differential resistance element and an output of the buffer circuit is placed as an output signal.

A preferable mode is one wherein the latch circuit comprises a third negative differential resistance element and a fourth negative differential resistance element which are connected in series between a reference potential and a power supply potential.

Also, a preferable mode is one wherein the second negative differential resistance element is a resonant tunnel diode.

Also, a preferable mode is one wherein the first negative differential resistance element is a parallel-connected element consisting of a resonant tunnel diode and an FET element.

Also, a preferable mode is one wherein the vibration voltage supplying circuit is adapted to directly supply the clock signal to a power supply terminal of the series circuit as an operating power supply thereof.

Also, a preferable mode is one wherein the vibration voltage supplying circuit is adapted to supply an operating power supply for the series circuit via an FET element which is turned ON and OFF in synchronization with the clock signal.

With the above configuration, it is possible to reduce, as compared to the prior art example, the number of elements required in the circuit and also to reduce the area occupied by the circuit by approximately 20%. With a decrease in the number of the elements also, power consumption and the wiring delay time can be reduced, thus enabling high-speed operations.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Figure 1:
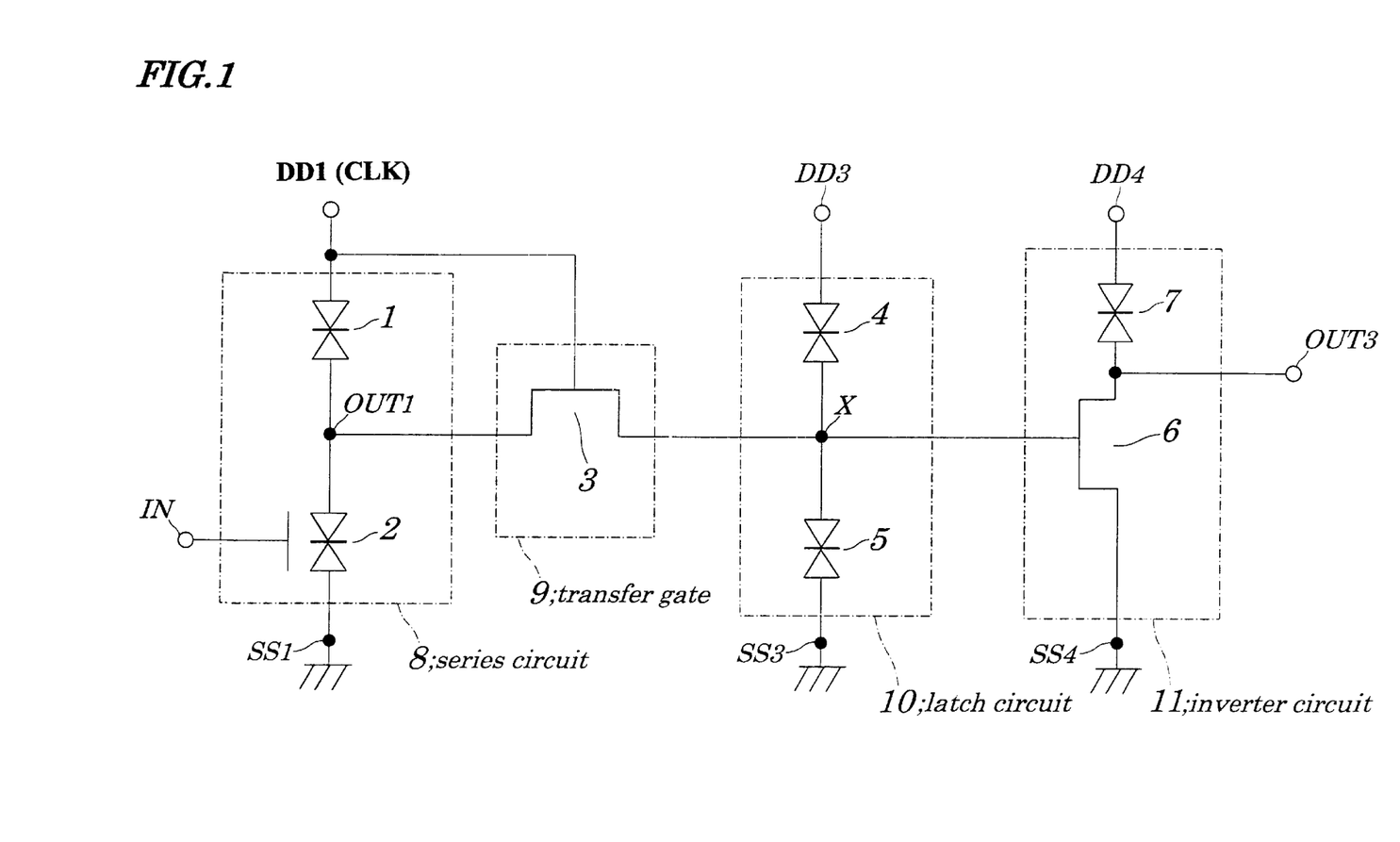
FIG. 1 is a circuit diagram of a first embodiment of the present invention.

The following will describe embodiments of the present invention with reference to accompanying drawings. In FIGS. 1 and 5, same reference numerals indicate similar functions. In a circuit shown in FIG. 1, a series circuit 8, a transfer gate 9, a latch circuit 10, and an inverter circuit 11 are connected in this order between an input terminal IN and a circuit output terminal OUT3.

The series circuit 8 includes a negative differential resistance element 1 and a negative differential resistance element 2 which has a control terminal for controlling a value of an element current which are connected in series, in such a configuration that one end of the negative differential resistance element 1 is connected to an output terminal OUT1, which is a series connection point, and an other end of the negative differential resistance element 1, to a power supply terminal DD1. In this configuration, one end of the negative differential resistance element 2 is connected to the output terminal OUT1, which is the series connection point, and an other end, to a ground terminal SS1. Also, the control terminal of the negative differential resistance element 2 is supplied with an input signal for the input terminal IN, while to the power supply terminal DD1 is applied a clock signal CLK.

The transfer gate 9 is constituted by an FET element 3, to a control terminal of which is applied the clock signal CLK.

The latch circuit 10 includes negative differential resistance elements 4 and 5 which are connected in series in such a configuration that one end of the negative differential resistance element 4 is connected to a series connection point terminal X and an other end, to a power supply terminal DD3. Also, one end of the negative differential resistance element 5 is connected to the series connection point terminal X and an other end, to a ground terminal SS3.

The inverter circuit 11 includes an FET element 6 as a drive element and a negative differential resistance element 7 as a load element in such a configuration that one end of the FET element 6 is connected to the circuit output terminal OUT3 and an other end, to a ground terminal SS4. Also, one end of the negative differential resistance element 7 is connected to the circuit output terminal OUT3 and an other end, to a power supply terminal DD4.

The following will describe an embodiment wherein a resonant tunnel diode is employed as the negative differential resistance elements 1, 4, 5, and 7, a parallel-connected element consisting of a resonant tunnel diode and an FET is employed as the negative differential resistance element 2, and an N-channel type FET is employed as an FET element 3 constituting the transfer gate 9 and an FET element 6.

The clock signal CLK is applied to both the power supply terminal DD1 for the series circuit 8 and a control terminal of the FET element 3 which constitutes the transfer gate 9. As shown in FIG. 6, at the leading edge of the clock signal CLK, an inverted signal of an input is output at the output terminal OUT1. When the clock signal CLK becomes High, the transfer gate 9 opens, to feed a potential of the output terminal OUT1 to the terminal X of the latch circuit 10. In this case, by flowing a current level of the negative differential resistance elements 4 and 5 of the latch circuit 10 sufficiently less than that of the elements of the series circuit 8 and the transfer gate 9, the potential appearing at the output terminal OUT1 can be transferred to the terminal X, not being influenced by the latch circuit 10, as long as the transfer gate 9 is open.

The potential of the terminal X is inverted again at the last-stage inverter circuit 11, thus placing at the circuit output terminal OUT3 a signal having a same phase as the input signal. As described with the prior art example, when the clock signal CLK is at High, the output terminal OUT1 remains unchanged in potential even when the input signal has changed in level. When the potential of the output terminal OUT1 is transferred to the terminal X, the FET element 3 constituting the transfer gate 9 is cut off.

When the clock signal CLK rises in level next time, the output terminal OUT1 becomes Low and, at a same time, the control terminal of the transfer gate 9 also becomes Low in potential, so that the FET element 3 constituting the transfer gate 9 stays in a cut-off state and the transfer gate 9 remains closed. Therefore, the potential of the terminal X continues to be held by the latch circuit 10, so that resultantly, output of the inverter circuit can hold its previous value even when the clock signal CLK becomes Low, thus constituting a positive-going-edge-trigger type D flip-flop circuit also in a circuit according to the present invention. The circuit configuration of the present invention enables it to constitute that type of D flip-flop circuit only with eight elements, which is fewer than with the prior art circuit.

The latch circuit 10 only holds the potential of the terminal X when the FET element 3 constituting the transfer gate 9 is in the cut-off state, so that the input to the last-stage inverter circuit 11 is driven directly by the output from the series circuit 8 when the transfer gate 9 is open. Therefore, the operating speed of the circuit as a whole is not affected even when the current level of the negative differential resistance elements 4 and 5 of the latch circuit 10 is extremely reduced as long as its latching operation is secured.

Figure 2:
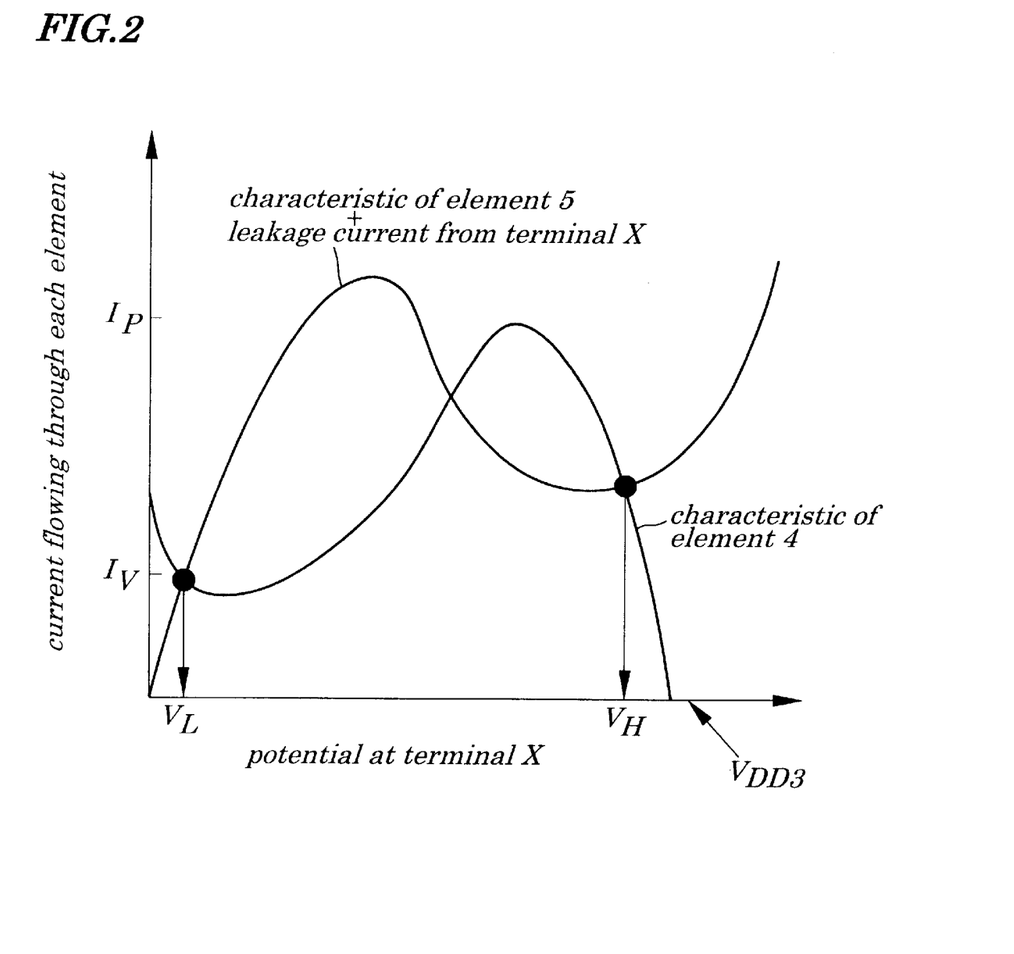
FIG. 2 is a graph showing operations of a latch circuit constituting an embodiment of FIG. 1.

FIG. 2 shows operations of the latch circuit 10 when the transfer gate 9 is closed. As shown, on a characteristic curve of the negative differential resistance element 5 are superimposed a leakage current of the next-stage inverter circuit and that of the FET element 3 constituting the transfer gate 9. In order to enable latching, a sum of these leakage currents and a barre current of the negative differential resistance element 5 must only be smaller than a peak current of the negative differential resistance element 4. In other words, the current level of the negative differential resistance elements 4 and 5 can be reduced to the above-mentioned leakage current level, thus extremely suppressing power consumption of the latch circuit 10.

Figure 3:
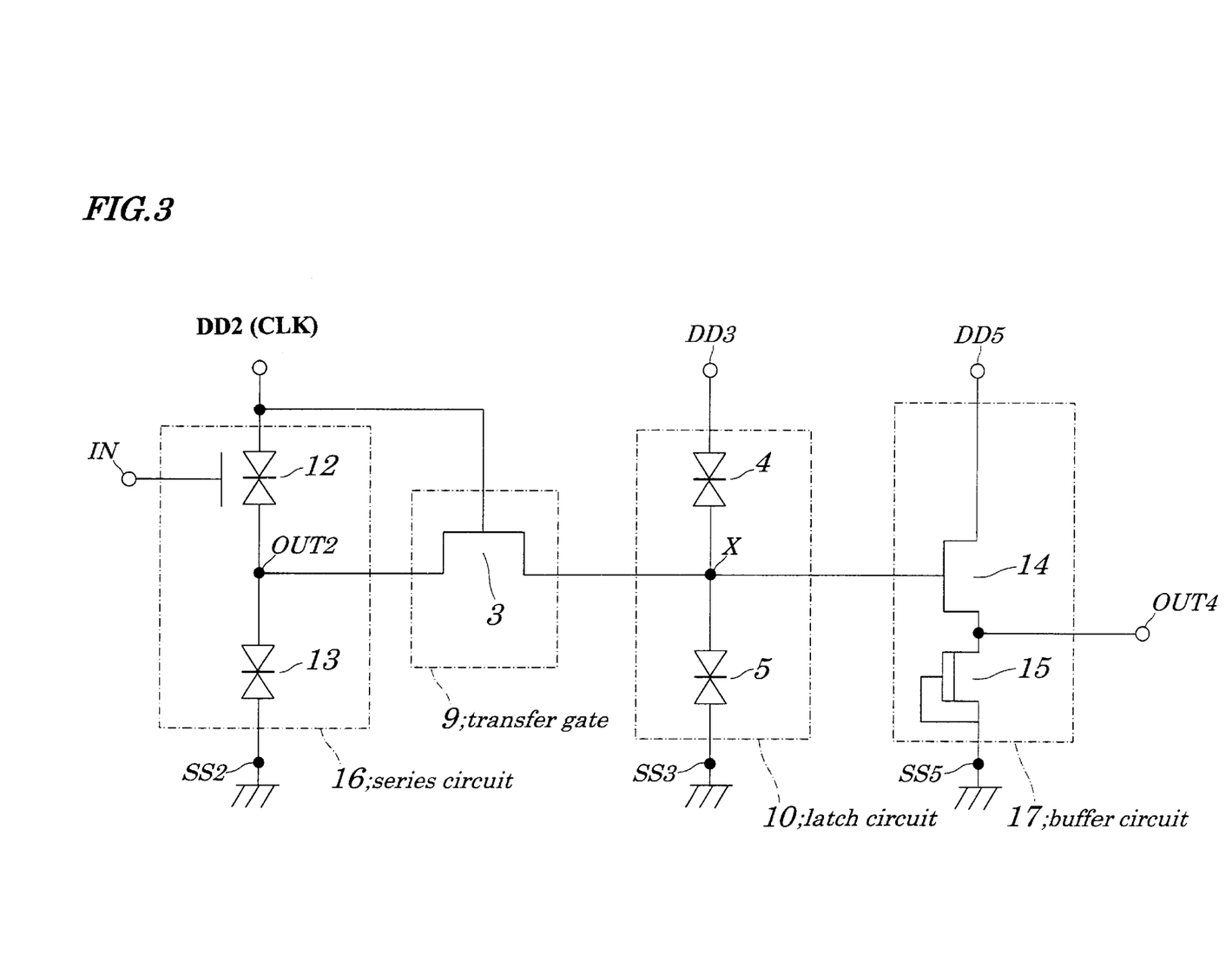
FIG. 3 is a circuit diagram of a second embodiment of the present invention.

In FIG. 3, same reference numerals as in FIGS. 1 and 5 indicate same functions in all these figures. In a circuit shown in FIG. 3, a series circuit 16, the transfer gate 9, the latch circuit 10, and a buffer circuit 17 are connected in this order between the input IN and a circuit output terminal OUT4. A description of components equivalent to those in the circuit according to the first embodiment of the present invention as shown in FIG. 1 is omitted here.

The series circuit 16 includes negative differential resistance elements 12 and 13 which are connected in series in such a configuration that one end of the negative differential resistance element 12 is connected to an output terminal OUT2, which is a series connection point, and an other end, to power supply terminal DD2. Also, one end of the negative differential resistance element 13 is connected to the output terminal OUT2, which is the series connection point, and an other end, to the ground terminal SS2. The control terminal of the negative differential resistance element 12 is supplied with an input signal to the input terminal IN, while to the power supply terminal DD2 is applied the clock signal CLK.

The buffer circuit 17 includes an FET element 14 as a drive element and a depletion-type FET element 15 as a load element in such a configuration that one end of the FET element 14 is connected to the circuit output terminal OUT4 and an other end, to a power supply terminal DD5. Also, one end of the FET element 15 is connected to the circuit output terminal OUT4 and an other end, to a ground terminal SS5.

The following will describe an embodiment wherein a resonant tunnel diode is employed as the negative differential resistance elements 13, 4, and 5, a parallel-connected element consisting of a resonant tunnel diode and an FET is employed as the negative differential resistance element 12, and a N-channel type FET is employed as the FET element 3 constituting transfer gate 9, the FET element 14 and the FET element 15.

The clock signal CLK is applied to the power supply terminal DD2 of the series circuit 16 and the control terminal of the FET element 3 constituting the transfer gate 9. As described with the prior art example, at the leading edge of the clock signal CLK, a signal having a same phase as the input is output at the output terminal OUT2. When the clock signal CLK becomes High completely, the transfer gate 9 is opened, thus transferring the potential of the output terminal OUT2 to the terminal X of the latch circuit 10. In this case, by reducing the current level of the negative differential resistance elements 4 and 5 of the latch circuit 10 sufficiently less than that of the elements of the series circuit 16 and the transfer gate 9, potential output at the output terminal OUT2 can be transferred to the terminal X, not being influenced by the latch circuit 10, as long as the transfer gate 9 is open.

The potential at the terminal X is output through the last-stage buffer circuit 17. As described with the prior art example, when the clock signal CLK is at High, the potential of the output terminal OUT2 is held as is even when the input has changed. When the potential of the output terminal OUT2 is transferred to the terminal X, the FET element 3 constituting the transfer gate 9 is cut off. When the clock signal CLK rises next time, the output terminal OUT2 becomes Low in potential and, at a same time, the control terminal of the transfer gate 9 also becomes Low in level, so that the FET element 3 constituting the transfer gate 9 stays in the cut-off state and the transfer gate 9 remains closed. With this, the potential of the terminal X continues to be held by the latch circuit 10. As a result, the output of the buffer circuit 17 can hold its previous value even when the clock signal CLK has become Low in level, thus constituting a positive-going-edge-trigger type D flip-flop circuit even in a circuit according to the present invention.

This circuit configuration according to the present embodiment, like the first embodiment, also can reduce a number of required elements down to eight, as compared to the prior art example. Like in the case of the first embodiment, in the circuit configuration according to the present embodiment also, the latch circuit 10 only holds the potential of the terminal X when the FET element 3 constituting the transfer gate 9 is in the cutoff state, so that the input of the last-stage buffer circuit 17 is driven directly by the output of the series circuit 16 when the transfer gate 9 is open. Therefore, the operating speed of the circuit as a whole is not affected even when the current level of the negative differential resistance elements 4 and 5 of the latch circuit 10 is extremely reduced as far as the latching is secured. With this, power consumption of the latch circuit 10 can be extremely suppressed.

Although in the first and second embodiments of the present invention, two negative differential resistance elements have been employed to constitute the latch circuit, a composite element consisting of a negative differential resistance element and a resistor may be used to provide the same functions.

Figure 4A:
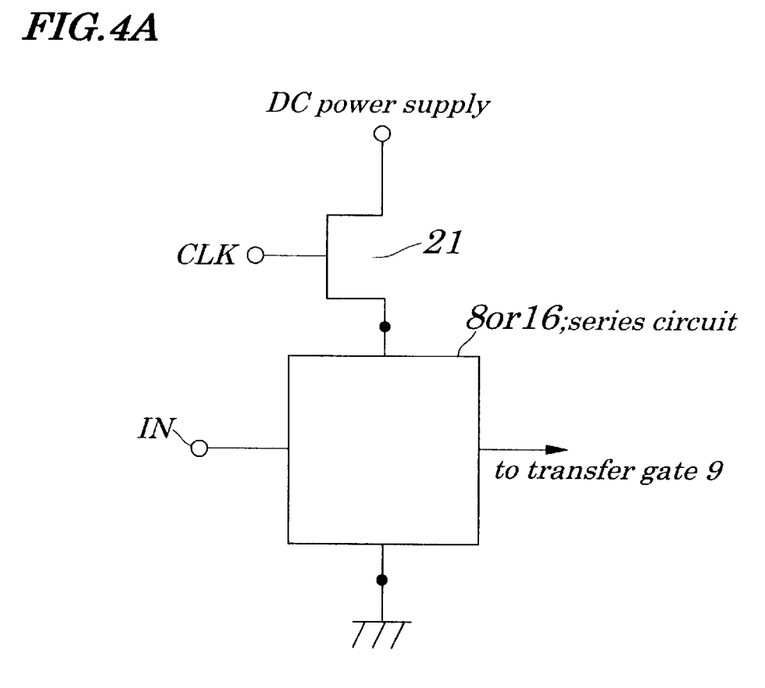
FIGS. 4A and 4B are block diagrams showing an example of a method of vibration voltage application in a circuit according to an embodiment of the present invention.
Figure 4B:
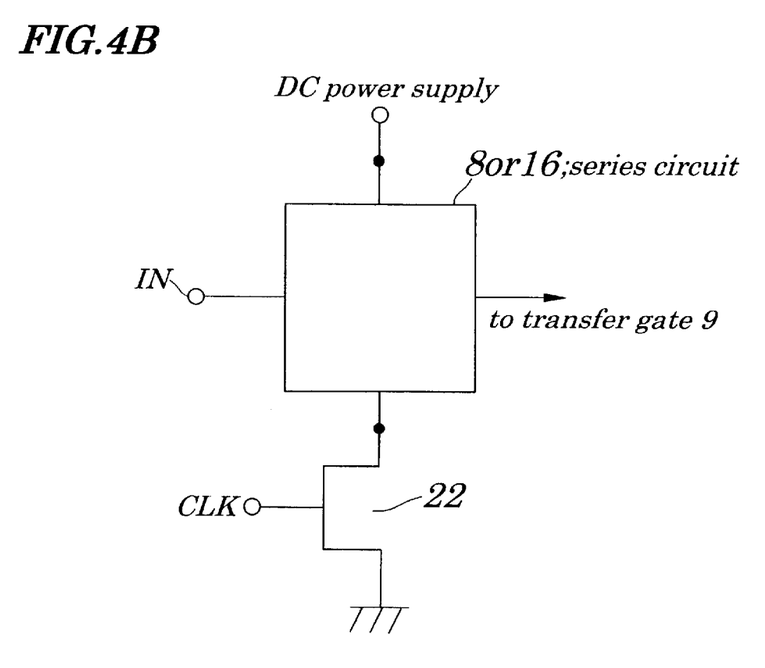

Also, although in the embodiments of the present invention, the clock signal has been directly applied to the series circuit to drive the series circuits 8, 16 with a vibration voltage synchronized with the clock signal, FET elements 21 and 22 may be added on the upper sides or the lower sides respectively of the series circuits 8, 16 as shown in FIGS. 4A and 4B so that the clock signal may be applied to the control gates of the FET elements 21 and 22.

Further also, although in the first and second embodiments of the present invention, a resonant tunnel diode and an FET have been used as the negative differential resistance elements, any other negative differential resistance element, inter-band tunnel diode, may be employed instead. Moreover, as the negative differential resistance element having the control terminal for controlling the current value, for example, such a tunnel transistor may be used as disclosed in Japanese Laid-Open Patent Application No. Hei05-41520 by Baba.

It is thus apparent that the present invention is not limited to the above embodiments but may be changed and modified without departing from the scope and spirit of the invention.

Finally, the present application claims the priority of Japanese Patent Application No. Hei11-120987 filed on Apr. 28, 1999, which is herein incorporated by reference.

What is claimed is:

1. A flip-flop circuit comprising:
   a series circuit which has a first negative differential resistance element and a second negative differential resistance element in such a configuration that one end of said first negative differential resistance element and one end of said second negative differential resistance element are interconnected at a common series connection point, that said second negative differential resistance element has a control terminal for controlling a value of an element current, and that said series connection point acts as an output terminal;
   clock supplying circuit for supplying a clock signal as an operating power supply for said series circuit;
   a latch circuit;
   a transfer gate which is disposed between an output terminal of said series circuit and said latch circuit and also which is turned ON and OFF by said clock signal; and
   an inverter circuit which is connected to said latch circuit;
   wherein an input signal is applied to said control terminal of said second negative differential resistance element, while an output of said inverter circuit is placed as an output signal.

2. The flip-flop circuit according to claim 1, wherein said latch circuit comprises a third negative differential resistance element and a fourth negative differential resistance element which are connected in series between a reference potential and a power supply potential.

3. The flip-flop circuit according to claim 1 wherein said first negative differential resistance element is a resonant tunnel diode.

4. The flip-flop circuit according to claim 1, wherein said second negative differential resistance element is a parallel-connected element consisting of a resonant tunnel diode and an FET element.

5. A flip-flop circuit comprising:
   a series circuit which has a first negative differential resistance element and a second differential resistance element in such a configuration that one end of said first negative differential resistance element and one end of said second negative differential resistance element are interconnected at a common series connection point, that at least said first negative differential resistance element has a control terminal for controlling a value of an element current, and that said common series connection point acts as an output terminal;

clock supplying circuit for supplying a clock signal as an operating power supply for said series circuit;

a latch circuit;

a transfer gate which is disposed between an output terminal of said series circuit and said latch circuit and also which is turned ON and OFF by said clock signal; and a buffer circuit which is connected to said latch circuit;

wherein an input signal is applied to said control terminal of said first negative differential resistance element and an output of said buffer circuit is placed as an output signal.

6. The flip-flop circuit according to claim 5, wherein said latch circuit comprises a third negative differential resistance element and a fourth negative differential resistance element which are connected in series between a reference potential and a power supply potential.

7. The flip-flop circuit according to claim 5, wherein said second negative differential resistance element is a resonant tunnel diode.

8. The flip-flop circuit according to claim 5, wherein said first negative differential resistance element is a parallel-connected element consisting of a resonant tunnel diode and an FET element.

* * * * *